(12) United States Patent
Konishi et al.

(10) Patent No.: US 9,023,677 B2
(45) Date of Patent: May 5, 2015

(54) METHOD FOR PRODUCING SPOT SIZE CONVERTER

(71) Applicant: Sumitomo Electric Industries, Ltd., Osaka (JP)

(72) Inventors: Naoko Konishi, Yokohama (JP); Hideki Yagi, Machida (JP); Ryuji Masuyama, Kamakura (JP); Yoshihiro Yoneda, Isehara (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/267,556

(22) Filed: May 1, 2014

(65) Prior Publication Data

US 2014/0335644 A1    Nov. 13, 2014

(30) Foreign Application Priority Data

May 9, 2013    (JP) ................................. 2013-099339

(51) Int. Cl.
    *H01L 21/00*       (2006.01)
    *H01L 31/0232*       (2014.01)
    *H01L 31/18*       (2006.01)

(52) U.S. Cl.
    CPC .......... *H01L 31/02325* (2013.01); *H01L 31/18* (2013.01)

(58) Field of Classification Search
None
See application file for complete search history.

(56) References Cited

U.S. PATENT DOCUMENTS

2002/0141682 A1\*    10/2002    Ryu et al. ....................... 385/14

FOREIGN PATENT DOCUMENTS

JP       2001-127333       5/2001

\* cited by examiner

*Primary Examiner* — Kyoung Lee
(74) *Attorney, Agent, or Firm* — Smith, Gambrell & Russell LLP

(57) ABSTRACT

A method for producing a spot size converter includes the steps of forming a first insulator mask on a stacked semiconductor layer; forming first and second terraces, and a waveguide mesa disposed between the first and second terraces by etching the stacked semiconductor layer using the first insulator mask, the first terrace having first to fourth terrace portions, the second terrace having fifth to eighth terrace portions, the waveguide mesa having first to fourth mesa portions; forming a second insulator mask including a first pattern on the first terrace portion, a second pattern on the fifth terrace portion, a third pattern on the third and fourth mesa portions, and a fourth pattern that integrally covers a region extending from the fourth terrace portion to the eighth terrace portion through the fourth mesa portion; and selectively growing a semiconductor layer by using the second insulator mask.

9 Claims, 16 Drawing Sheets

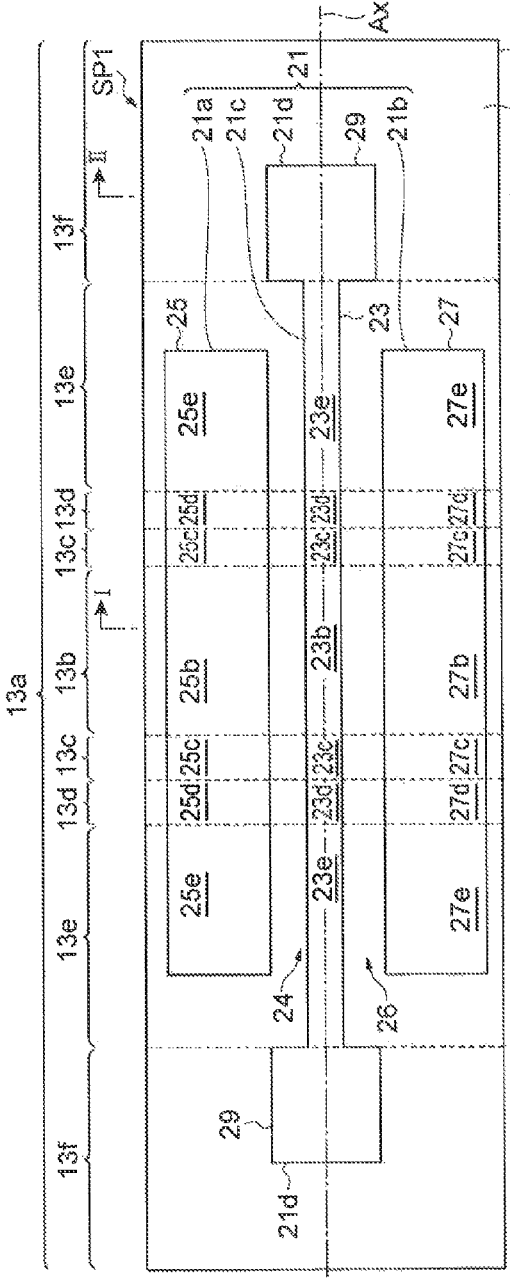
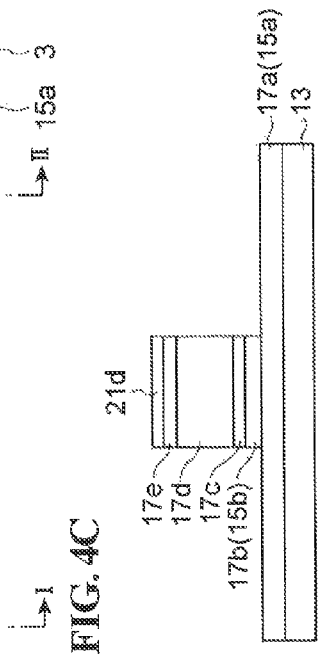
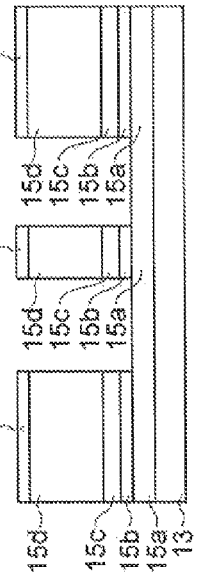
FIG. 4A
FIG. 4B
FIG. 4C

METHOD FOR PRODUCING SPOT SIZE CONVERTER

BACKGROUND OF THE INVENTION

1. Field of the Invention

The present invention relates to a method for producing a spot size converter.

2. Description of the Related Art

Japanese Unexamined Patent Application Publication No. 2001-127333 discloses a semiconductor light-receiving device. This semiconductor light-receiving device has a suitable structure for a high-speed operation. The semiconductor light-receiving device includes a light-detecting portion formed on a main surface of a substrate. The light-detecting portion includes an absorption layer that is composed of a semiconductor. The absorption layer receives light and generates a carrier in accordance with the intensity of the light. A waveguide is formed on the main surface of the substrate. The waveguide is optically coupled to the light-detecting portion. The waveguide guides light in a direction parallel to the main surface (waveguide direction) so that the light is incident on the absorption layer of the light-detecting portion. A photocurrent from the absorption layer of the light-detecting portion flows in the thickness direction of the absorption layer. Then, the photocurrent from the absorption layer is outputted to the outside through a pair of electrodes.

SUMMARY OF THE INVENTION

When the semiconductor light-receiving device disclosed in Japanese Unexamined Patent Application Publication No. 2001-127333 is optically coupled to an optical fiber, a coupling loss is generated because of the difference in the mode field diameters between the semiconductor waveguide and the optical fiber. Specifically, the mode field diameter of the semiconductor waveguide is smaller than that of the optical fiber. As a result, a light-receiving sensitivity of the semiconductor light-receiving device decreases. In order to match the mode field diameter of the optical fiber with the mode field diameter of the semiconductor waveguide, a spot size converter (SSC) is monolithically integrated with the semiconductor light-receiving device.

However, in order to expand a mode field diameter of a semiconductor waveguide, the spot size converter has a size larger than the size (waveguide width and waveguide height) of the original semiconductor waveguide. In producing the spot size converter having such dimensions, the manufacturing process and the device structure are complicated.

A method for producing a spot size converter according to the present invention includes the steps of (a) preparing a substrate including a main surface having a first area, a second area, a third area, and a fourth area that are arranged in a direction of a waveguide axis; (b) forming a stacked semiconductor layer disposed on the main surface of the substrate; (c) forming a first insulator mask on the stacked semiconductor layer; (d) forming a substrate product including a first terrace, a second terrace, and a waveguide mesa disposed between the first terrace and the second terrace by etching the stacked semiconductor layer using the first insulator mask, the first terrace having a first terrace portion, a second terrace portion, a third terrace portion, and a fourth terrace portion that are respectively disposed on the first area, the second area, the third area, and the fourth area, the second terrace having a fifth terrace portion, a sixth terrace portion, a seventh terrace portion, and an eighth terrace portion that are respectively disposed on the first area, the second area, the third area, and the fourth area, the waveguide mesa having a first mesa portion, a second mesa portion, a third mesa portion, and a fourth mesa portion that are respectively disposed on the first area, the second area, the third area, and the fourth area; (e) forming a second insulator mask on the substrate product, the second insulator mask including a first pattern disposed on the first terrace portion, a second pattern disposed on the fifth terrace portion, a third pattern disposed on the third mesa portion and the fourth mesa portion, and a fourth pattern that integrally covers a region extending from the fourth terrace portion to the eighth terrace portion through the fourth mesa portion; and (f) selectively growing a semiconductor layer on the substrate product by using the second insulator mask.

According to the method for producing a spot size converter, in the step of selectively growing the semiconductor layer using the second insulator mask, the first mesa portion and the second mesa portion are not covered with the second insulator mask. The first mesa portion is located between the first pattern on the first terrace portion and the second pattern on the fifth terrace portion. Accordingly, a raw material that has not been consumed on the first pattern and the second pattern passes over trenches between the first terrace portion and the first mesa portion and between the fifth terrace portion and the first mesa portion and is additionally supplied to the first mesa portion in two directions from the first terrace portion to the first mesa portion and from the fifth terrace portion to the first mesa portion. As a result, the growth in the first mesa portion increases, and the height of the first mesa portion increases.

Furthermore, the second terrace portion and the sixth terrace portion are not covered with the second insulator mask, and the second mesa portion is located between the second terrace portion and the sixth terrace portion. Therefore, a raw material for growth is consumed on the second terrace portion and the sixth terrace portion. In addition, the raw material for growth is consumed also on the second mesa portion, and thus a semiconductor layer is grown. Furthermore, the third pattern of the second insulator mask is located on the third mesa portion and the fourth mesa portion. The fourth pattern of the second insulator mask integrally covers a region extending from the fourth terrace portion to the eighth terrace portion through the fourth mesa portion. Accordingly, a semiconductor layer is not grown on the third mesa portion and the fourth mesa portion. Therefore, the height of the third mesa portion and the height of the fourth mesa portion do not change. However, a part of the raw material that has not been consumed on the third pattern and the fourth pattern is additionally supplied to the second mesa portion, which is located adjacent to the third pattern and the fourth pattern and is not covered with a pattern.

By using the second insulator mask, an optical waveguide in which the height of a mesa is changed in a direction of a waveguide axis is formed. This waveguide shape may be used for converting a spot size of light propagating through the optical waveguide. Thus, a spot size converter (SSC) may be realized by using this waveguide.

The method for producing a spot size converter according to the present invention may further include a step of, after forming the substrate product including the first terrace, the second terrace, and the waveguide mesa, forming a first resist mask on the insulator mask, the first resist mask having a first resist pattern disposed on the first terrace portion, a second resist pattern disposed on the fifth terrace portion, and a third resist pattern disposed on the third mesa portion and the fourth mesa portion. The step of forming the second insulator mask may include the steps of etching the first insulator mask using the first resist mask to form a third insulator mask; after removing the first resist mask, forming an insulating layer on the substrate product to form a composite insulating layer; forming a second resist mask having a pattern that integrally covers the composite insulating layer on the fourth terrace portion, the fourth mesa portion, and the eighth terrace portion; and etching the composite insulating layer using the second resist mask.

According to the method for producing a spot size converter, after forming substrate product including the first terrace, the second terrace, and the waveguide mesa, the first resist mask is formed on the first insulator mask. In the step of forming the second insulator mask, the first insulator mask is etched by using the first resist mask to form the third insulator mask. The first resist mask has the first resist pattern, the second resist pattern, and the third resist pattern. The first resist pattern is disposed on the first terrace portion, and corresponds to the first pattern. The second resist pattern is disposed on the fifth terrace portion, and corresponds to the second pattern. The third resist pattern is disposed on the third mesa portion the fourth mesa portion, and corresponds to the third pattern. Subsequently, the insulating layer is formed to form the composite insulating layer. Subsequently, the composite insulating layer is etched by using the second resist mask having the pattern that integrally covers the composite insulating layer on the fourth terrace portion, the fourth mesa portion, and the eighth terrace portion.

Accordingly, while partially maintaining the shape of the first insulator mask, an additional mask portion is prepared by forming the composite insulating layer including the insulating layer, and patterning the composite insulating layer using the second resist mask. Thus, the second insulator mask is formed. An optical waveguide in which the height of a mesa is changed in the direction of the waveguide axis may be formed by selectively growing the semiconductor layer on the substrate product including the first terrace, the second terrace, and the waveguide mesa, all of which have been formed by etching the stacked semiconductor layer.

In the method for producing a spot size converter according to the present invention, the composite insulating layer may include a thick-film portion including the insulating layer and the third insulator mask, and a thin-film portion including the insulating layer. The thick-film portion has a thickness larger than that of the thin-film portion. According to the method, in the step of etching the composite insulating layer using the second resist mask, the thick-film portion is left even when the composite insulating layer is not covered with the second resist mask. On the other hand, the thin-film portion that is not covered with the second resist mask is removed. Therefore, the second insulator mask including the first pattern, the second pattern, the third pattern, and the fourth pattern is preferably formed.

In the method for producing a spot size converter according to the present invention, the main surface of the substrate preferably has a fifth area. The fourth area is preferably disposed between the third area and the fifth area. The stacked semiconductor layer preferably includes a laminated structure disposed on the fifth area, the laminated structure including an absorption layer of a semiconductor device. The second insulator mask preferably includes a fifth pattern covering a top surface of the laminated structure on the fifth area. In addition, the step of forming substrate product including the first terrace, the second terrace, and the waveguide mesa preferably includes forming a device mesa by etching the stacked semiconductor layer using the first insulator mask.

According to this method, the device mesa including the laminated structure including the absorption layer of a semiconductor device is optically connected to the waveguide mesa. Therefore, in addition to the waveguide for converting a spot size, the semiconductor device that is optically connected to the waveguide mesa is also monolithically produced on a single substrate.

In the method for producing a spot size converter according to the present invention, in the step of selectively growing the semiconductor layer, the semiconductor layer may be grown on a side surface of the device mesa.

According to this method, the semiconductor layer grown on the side surface of the device mesa is used as a protective film of the semiconductor device.

In the method for producing a spot size converter according to the present invention, the first pattern of the second insulator mask may include a first edge that extends along an edge of an upper surface of the first terrace portion and a second edge that extends from an end of the first edge of the first pattern and gradually deviates from the edge of the upper surface of the first terrace portion in a direction from the second area to the first area. The second pattern of the second insulator mask may include a first edge that extends along an edge of an upper surface of the fifth terrace portion and a second edge that extends from an end of the first edge of the second pattern and gradually deviates from the edge of the upper surface of the fifth terrace portion in a direction from the second area to the first area.

According to this method, the degree of consumption of a raw material for growth on the semiconductor terraces may be adjusted by using the second insulator mask that includes the first pattern (second pattern) including the first edge that extends along the edge of the upper surface of the first terrace portion (fifth terrace portion) and the second edge that extends from the end of the first edge and gradually deviates from the edge of the upper surface of the first terrace portion (fifth terrace portion) in the direction from the second area to the first area. Therefore, in the step of selectively growing the semiconductor layer by using the second insulator mask, it is possible to adjust the degree of a mesa height that changes in the direction of the waveguide axis.

In the method for producing a spot size converter according to the present invention, the first terrace and the waveguide mesa are preferably defined by a first trench that is located between the first terrace and the waveguide mesa, the first trench including a first groove portion located between the first terrace portion and the first mesa portion. The second terrace and the waveguide mesa are preferably defined by a second trench that is located between the second terrace and the waveguide mesa, the second trench including a second groove portion located between the fifth terrace portion and the first mesa portion. Each of the first and second groove portions may have a bottom surface and a side surface. Furthermore, in the step of selectively growing the semiconductor layer, preferably, the bottom surfaces and the side surfaces of the first and second groove portions are not covered with the second insulator mask.

According to this method, the bottom surface and the side surface of the first groove portion and the bottom surface and the side surface of the second groove portion are not covered with the insulator mask. However, the terraces and the waveguide mesa are each formed from the stacked semiconductor layer, and have substantially the same height. Therefore, the raw material for growth that has not been consumed on the terraces migrates along the surface of the second insulator mask on the terraces, passes over the first groove portion and the second groove portion, and arrives on the waveguide mesa having a height substantially the same as that of the terraces.

In the method for producing a spot size converter according to the present invention, the waveguide mesa may include a first cladding layer, a core layer, and a second cladding layer that are sequentially disposed on the main surface of the substrate. The second cladding layer may be composed of InP. The semiconductor layer that is selectively grown on the substrate product may be composed of InP.

According to this method, in the step of selectively growing the semiconductor layer on the substrate product, the InP layer that is composed of the same material as that of the second cladding layer is grown on the second cladding layer of the waveguide mesa exposed through the second insulator mask.

In the method for producing a spot size converter according to the present invention, in the step of selectively growing the semiconductor layer, the waveguide mesa preferably includes a spot size converter (SSC) portion in the first mesa portion. The spot size converter portion may have a height larger than that of the third mesa portion. In addition, the spot size converter portion may include a portion having a width that tapers in a direction away from the main surface of the substrate.

BRIEF DESCRIPTION OF THE DRAWINGS

FIGS. 4A to 4C are schematic views illustrating a main step in the method for producing a spot size converter according to the embodiment.

DESCRIPTION OF THE PREFERRED EMBODIMENTS

Figure 1:
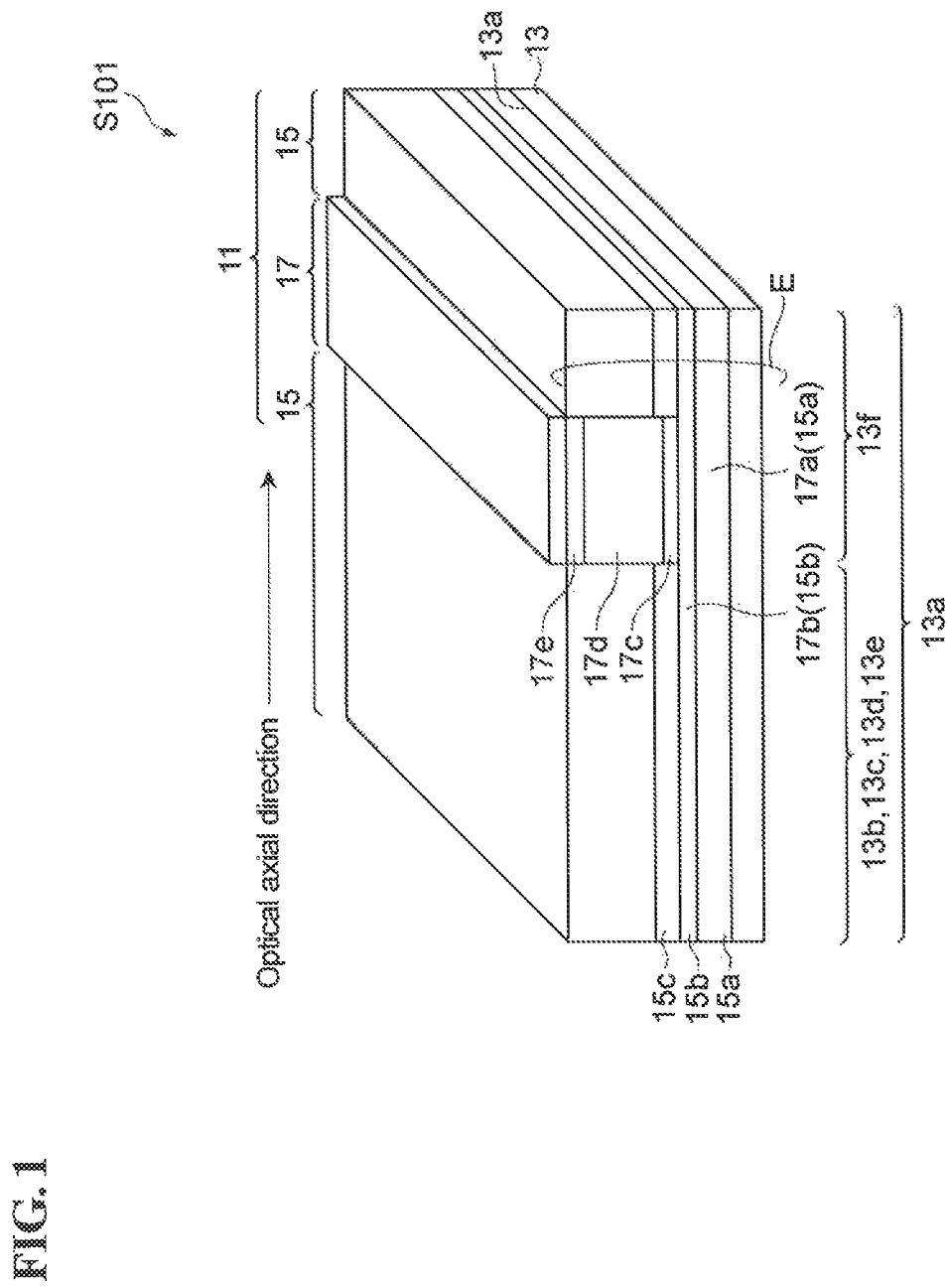
FIG. 1 is a schematic view illustrating a main step in a method for producing a spot size converter according to an embodiment.

A method for producing a spot size converter, and a spot size converter according to an embodiment of the present invention will now be described with reference to the attached drawings. The same parts are assigned the same reference numerals, if available.

FIGS. 1 to 14 are each a schematic view illustrating a main step in a method for producing a spot size converter according to the present embodiment.

As illustrated in FIG. 1, in step S101, an epitaxial substrate E is prepared. In the present embodiment, the epitaxial substrate E includes a stacked semiconductor layer 11 and a substrate 13. A main surface 13a of the substrate 13 includes a first area 13b, a second area 13c, a third area 13d, a fourth area 13e, and a fifth area 13f. The stacked semiconductor layer 11 is provided on the main surface 13a of the substrate 13. The stacked semiconductor layer 11 includes a plurality of semiconductor layers provided on the main surface 13a of the substrate 13. In the present embodiment, the stacked semiconductor layer 11 includes a semiconductor laminate 15 for forming a waveguide and a semiconductor laminate 17 for forming a semiconductor device different from the waveguide. The semiconductor laminate 15 is formed on the first area 13b, the second area 13c, the third area 13d, the fourth area 13e, and the fifth area 13f. The semiconductor laminate 17 is formed on the fifth area 13f. The formation of the semiconductor laminate 15 and the semiconductor laminate 17 is realized by, for example, a butt-joint method. In an embodiment, the semiconductor laminate 15 includes, for example, an n$^+$-type InP contact layer 15a, an n-type InP buffer layer 15b, i-GaInAsP core layer 15c, and an i-type InP cladding layer 15d. The semiconductor laminate 17 includes, for example, an n$^+$-type InP contact layer 17a (15a), a n-type InP buffer layer 17b (15b), an i-GaInAs optical absorption layer 17c, a p-type InP cladding layer 17d, and a p-GaInAs contact layer 17e. These III-V group compound semiconductor layers are each grown by, for example, a metal-organic vapor phase epitaxy (MOVPE) method. The band-gap energy of the i-GaInAsP core layer 15c is larger than the band-gap energy of the i-GaInAs optical absorption layer 17c.

Figure 2:
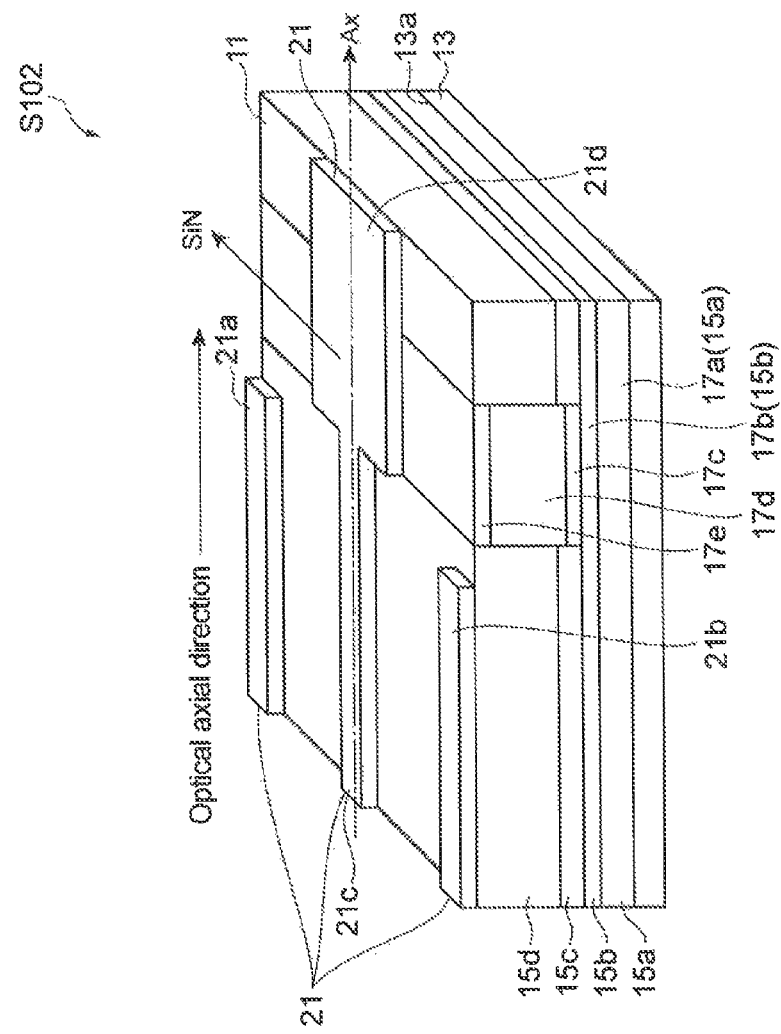
FIG. 2 is a schematic view illustrating a main step in the method for producing a spot size converter according to the embodiment.
Figure 3:
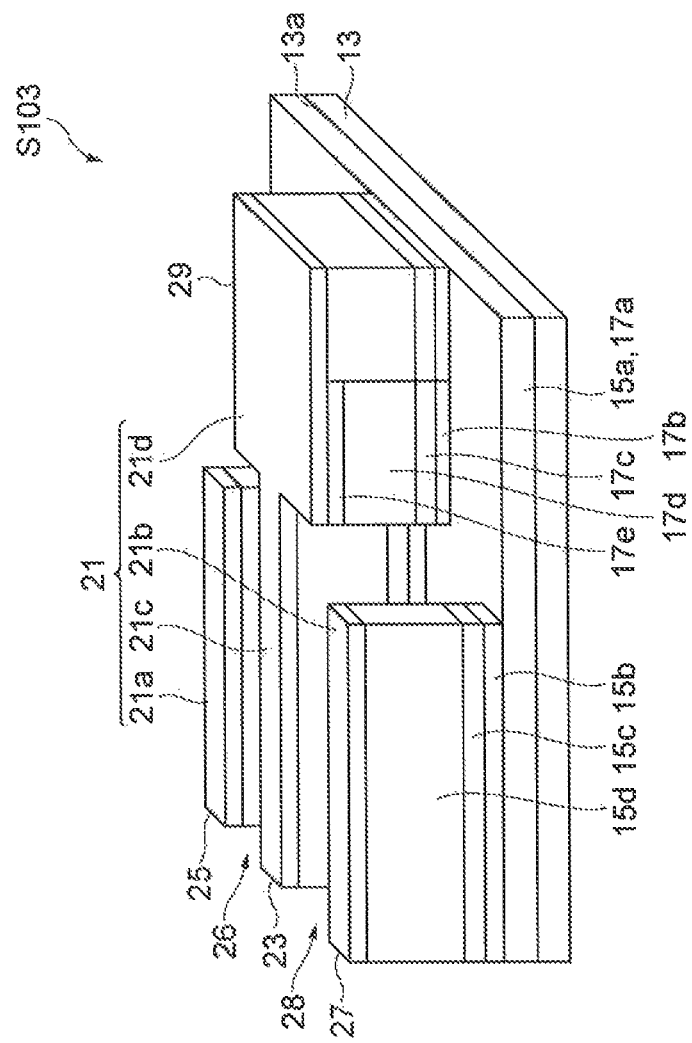
FIG. 3 is a schematic view illustrating a main step in the method for producing a spot size converter according to the embodiment.

As illustrated in FIG. 2, in step S102, an insulator mask 21 is formed on the stacked semiconductor layer 11 of the epitaxial substrate E. In the embodiment, the insulator mask 21 is a first insulator mask. The insulator mask 21 is constituted by, for example, a dielectric film composed of silicon dioxide (SiO$_2$), silicon oxynitride (SiON), silicon nitride (SiN), or the like. The insulator mask 21 is formed, for example, as follows. For example, a SiN film is deposited on the stacked semiconductor layer 11, and a resist is applied onto the SiN film. A pattern is formed in the resist by photolithography to form a resist mask. The SiN film is etched by dry etching using the resist mask. By this etching, a SiN mask is formed as the insulator mask 21. The insulator mask 21 includes a pattern for defining a waveguide mesa 23, a first terrace 25, a second terrace 27, and a semiconductor device mesa 29. More specifically, the insulator mask 21 includes a first terrace pattern 21a that defines the shape of the first terrace 25, a second terrace pattern 21b that defines the shape of the second terrace 27, a waveguide pattern 21c that defines the shape of the waveguide mesa 23, and a device pattern 21d that defines the shape of the semiconductor device mesa 29. The first terrace pattern 21a, the second terrace pattern 21b, and the waveguide pattern 21c are provided on the first area 13b to the fourth area 13e of the main surface 13a of the substrate 13. The waveguide pattern 21c is located between the first terrace pattern 21a and the second terrace pattern 21b. The waveguide pattern 21c is provided along a waveguide axis Ax extending in a direction in which a waveguide extends (for example, in an optical axis direction). The first terrace pattern 21a and the second terrace pattern 21b also extend along an edge of the first terrace 25 and an edge of the second terrace 27, respectively, in the direction of the waveguide axis Ax.

As illustrated in FIG. 3 and FIGS. 4A, 4B, and 4C, in step S103, the stacked semiconductor layer 11 of the epitaxial substrate E is etched by using the insulator mask 21 to form a waveguide mesa 23, a first terrace 25, a second terrace 27, and semiconductor device mesas 29. Referring to FIG. 4A, a first substrate product SP1 includes a waveguide mesa 23, a first terrace 25, a second terrace 27, and semiconductor device mesas 29. This etching is performed by, for example, a reactive ion etching (RIE) method. FIG. 4B illustrates a cross section of a first area 13b to a fourth area 13e and is a cross-sectional view taken along line I-I in FIG. 4A. FIG. 4C illustrates a cross section of the fifth area 13f and is a cross-sectional view taken along line II-II in FIG. 4A.

A first trench 24 that defines the first terrace 25 and the waveguide mesa 23 is located between the first terrace 25 and the waveguide mesa 23. A second trench 26 that defines the second terrace 27 and the waveguide mesa 23 is located between the second terrace 27 and the waveguide mesa 23. The waveguide mesa 23 includes a first mesa portion 23b, second mesa portions 23c, third mesa portions 23d, and fourth mesa portions 23e. The first mesa portion 23b, the second mesa portions 23c, the third mesa portions 23d, and the fourth mesa portions 23e are arranged in the direction of the waveguide axis Ax. The first mesa portion 23b is provided on the first area 13b. The second mesa portions 23c are provided on the second areas 13c. The third mesa portions 23d are provided on the third areas 13d. The fourth mesa portions 23e are provided on the fourth areas 13e.

The first terrace 25 includes a first terrace portion 25b, second terrace portions 25c, third terrace portions 25d, and fourth terrace portions 25e. The first terrace portion 25b is provided on the first area 13b. The second terrace portions 25c are provided on the second areas 13c. The third terrace portions 25d are provided on the third areas 13d. The fourth terrace portions 25e are provided on the fourth areas 13e. The first terrace portion 25b, the second terrace portions 25c, the third terrace portions 25d, and the fourth terrace portions 25e are sequentially arranged in the direction of the waveguide axis Ax.

The second terrace 27 includes a fifth terrace portion 27b, sixth terrace portions 27c, seventh terrace portions 27d, and eighth terrace portions 27e. The fifth terrace portion 27b is provided on the first area 13b. The sixth terrace portions 27c are provided on the second areas 13c. The seventh terrace portions 27d are provided on the third areas 13d. The eighth terrace portions 27e are provided on the fourth areas 13e. The fifth terrace portion 27b, the sixth terrace portions 27c, the seventh terrace portions 27d, and the eighth terrace portions 27e are sequentially arranged in the direction of the waveguide axis Ax. The waveguide mesa 23 is provided between the first terrace 25 and the second terrace 27. The first terrace 25 is disposed with a gap between the waveguide mesa 23 and the first terrace 27. The second terrace 27 is disposed with a gap between the waveguide mesa 23 and the second terrace 27. The semiconductor device mesas 29 are provided on the fifth areas 13f. The waveguide mesa 23 is optically coupled to the semiconductor device mesas 29.

The substrate 13, the waveguide mesa 23, the first terrace 25, the second terrace 27, and the semiconductor device mesas 29 constitute the first substrate product SP1. As a result of the etching, the insulator mask 21 is provided on the first substrate product SP1.

In an embodiment, as illustrated in FIGS. 4A to 4C, the waveguide mesa 23, the first terrace 25, and the second terrace 27 include, for example, an $n^+$-type InP contact layer 15a, an n-type InP buffer layer 15b, an i-GaInAsP core layer 15c, and an i-type InP cladding layer 15d. The semiconductor device mesas 29 include, for example, an $n^+$-type InP contact layer 17a (15a), an n-type InP buffer layer 17b (15b), an i-GaInAs optical absorption layer 17c, a p-type InP cladding layer 17d, and a p-GaInAs contact layer 17e.

As illustrated in FIGS. 4A to 4C, after the etching described above, the insulator mask 21 is left on the first substrate product SP1. In an area that is exposed by the etching, the surface of the area is not covered with the insulator mask 21, and a semiconductor (for example, the semiconductor layer 15a) is exposed.

Figure 5:
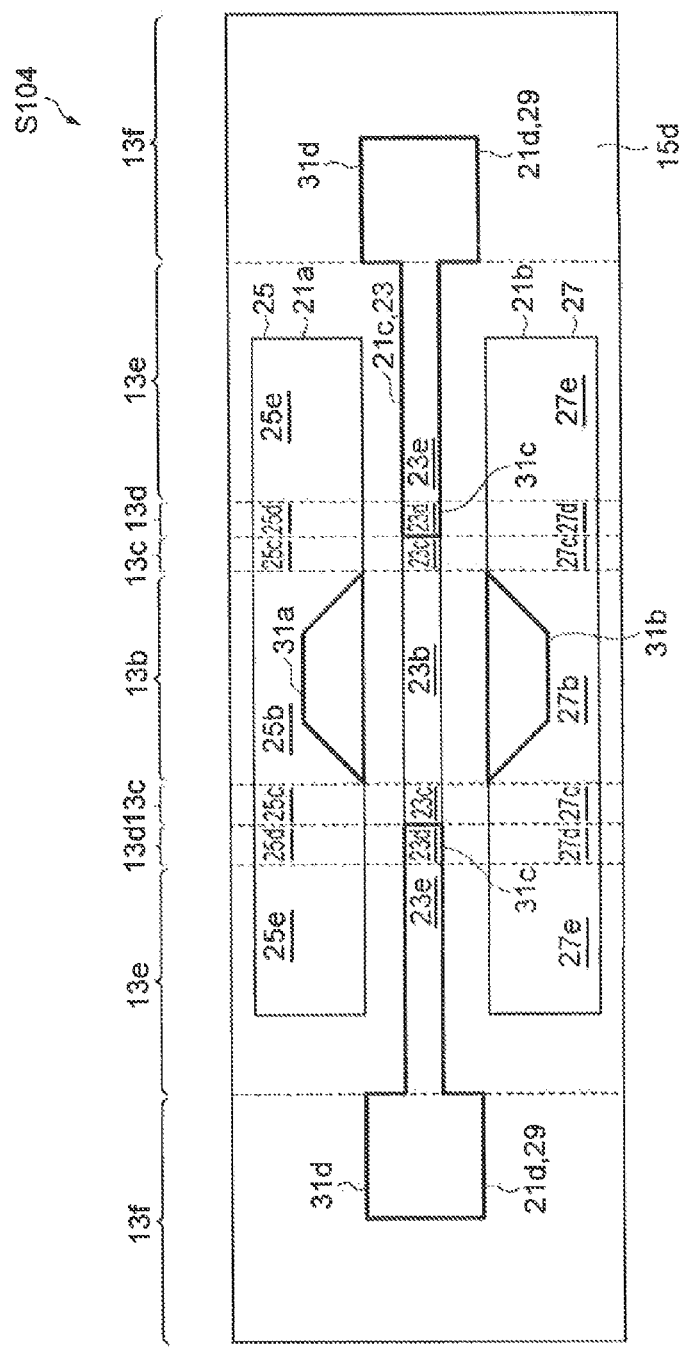
FIG. 5 is a schematic view illustrating a main step in the method for producing a spot size converter according to the embodiment.

In step S104, as illustrated in FIG. 5, a first resist mask 31 is formed on the insulator mask 21 on the first substrate product SP1. The first resist mask 31 includes a first resist pattern (corresponding to a first pattern) 31a, a second resist pattern (corresponding to a second pattern) 31b, third resist patterns (corresponding to third patterns) 31c, and fourth resist patterns (corresponding to fourth patterns) 31d. The first resist pattern 31a is formed on the insulator mask 21 of the first terrace portion 25b. The second resist pattern 31b is formed on the insulator mask 21 on the fifth terrace portion 27b. The third resist patterns 31c are formed on the insulator mask 21 of the third mesa portions 23d and the fourth mesa portions 23e. The fourth resist patterns 31d are formed on the insulator mask 21 of the semiconductor device mesas 29. The first resist mask 31 has an opening in an area except for the above patterns 31a to 31d, for example, an opening provided on the first mesa portion 23b, the second mesa portions 23c, the second terrace portions 25c, the third terrace portions 25d, the sixth terrace portions 27c, and the seventh terrace portions 27d.

Figure 6:
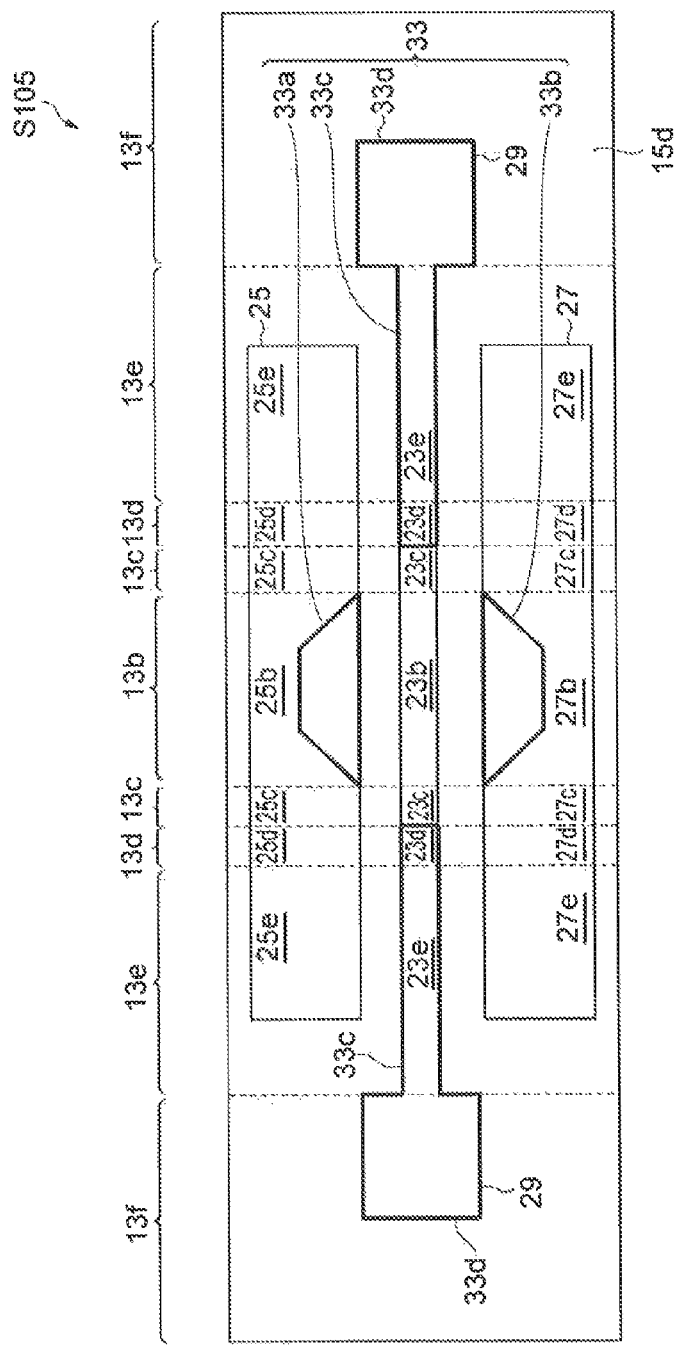
FIG. 6 is a schematic view illustrating a main step in the method for producing a spot size converter according to the embodiment.

In step S105, as illustrated in FIG. 6, the insulator mask 21 is etched by using the first resist mask 31 to form an insulator mask 33. In the embodiment, the insulator mask 33 is a third insulator mask. The insulator mask 21 is etched by using, for example, a dry etching process. When the insulator mask 21 is constituted by a SiN film, the insulator mask 33 having a pattern is constituted by the SiN film. The insulator mask 33 includes a first insulator pattern (corresponding to the first resist pattern) 33a, a second insulator pattern (corresponding to the second resist pattern) 33b, third insulator patterns (corresponding to the third resist patterns) 33c, and fourth insulator patterns (corresponding to the fourth resist patterns) 33d. The first insulator pattern 33a is formed on the insulator mask 21 of the first terrace portion 25b. The second insulator pattern 33b is formed on the insulator mask 21 of the fifth terrace portion 27b. The third insulator patterns 33c are formed on the insulator mask 21 of the third mesa portions 23d and the fourth mesa portions 23e. The fourth insulator patterns 33d are formed on the insulator mask 21 of the semiconductor device mesas 29. After the first resist mask 31 is removed, the insulator mask 33 including the first insulator pattern 33a, the second insulator pattern 33b, the third insulator patterns 33c, and the fourth insulator patterns 33d is formed.

Figure 7:
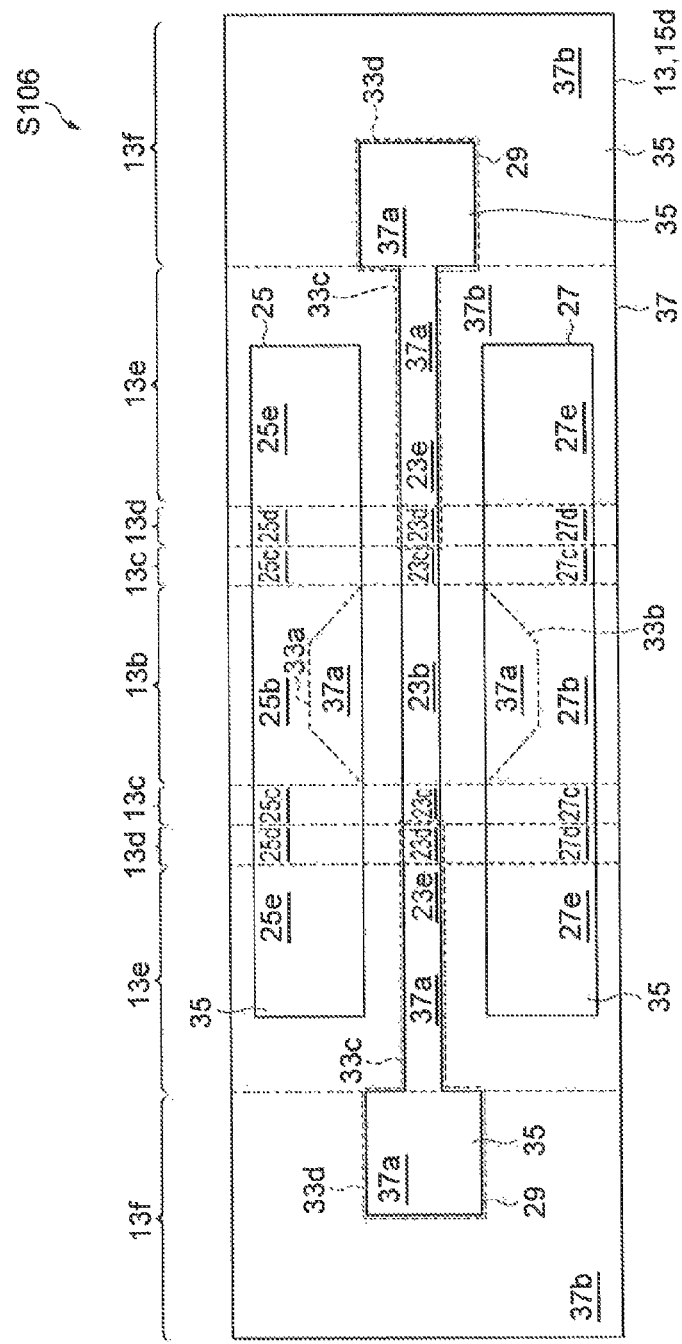
FIG. 7 is a schematic view illustrating a main step in the method for producing a spot size converter according to the embodiment.

In step S106, as illustrated in FIG. 7, after the formation of the patterned insulator mask 33, a new insulating layer 35 is formed on the first substrate product SP1. As a result, a composite insulating layer 37 including this insulating layer 35 and the insulator mask 33 is formed. The insulating layer 35 is deposited not only on upper surfaces of the waveguide mesa 23, the first terrace 25, the second terrace 27, and the semiconductor device mesas 29, but also on side surfaces and bottom surfaces thereof. The composite insulating layer 37 includes thick-film portions 37a including the insulating layer 35 and the insulating layer mask 33, and a thin-film portion 37b including only the insulating layer 35. The insulating layer 35 is constituted by, for example, a dielectric film composed of $SiO_2$, SiON, SiN, or the like. The insulating layer 35 is preferably composed of a material substantially the same as the material of the insulator mask 21. In the present embodiment, the insulating layer 35 is constituted by, for example, a SiN film.

Figure 8:
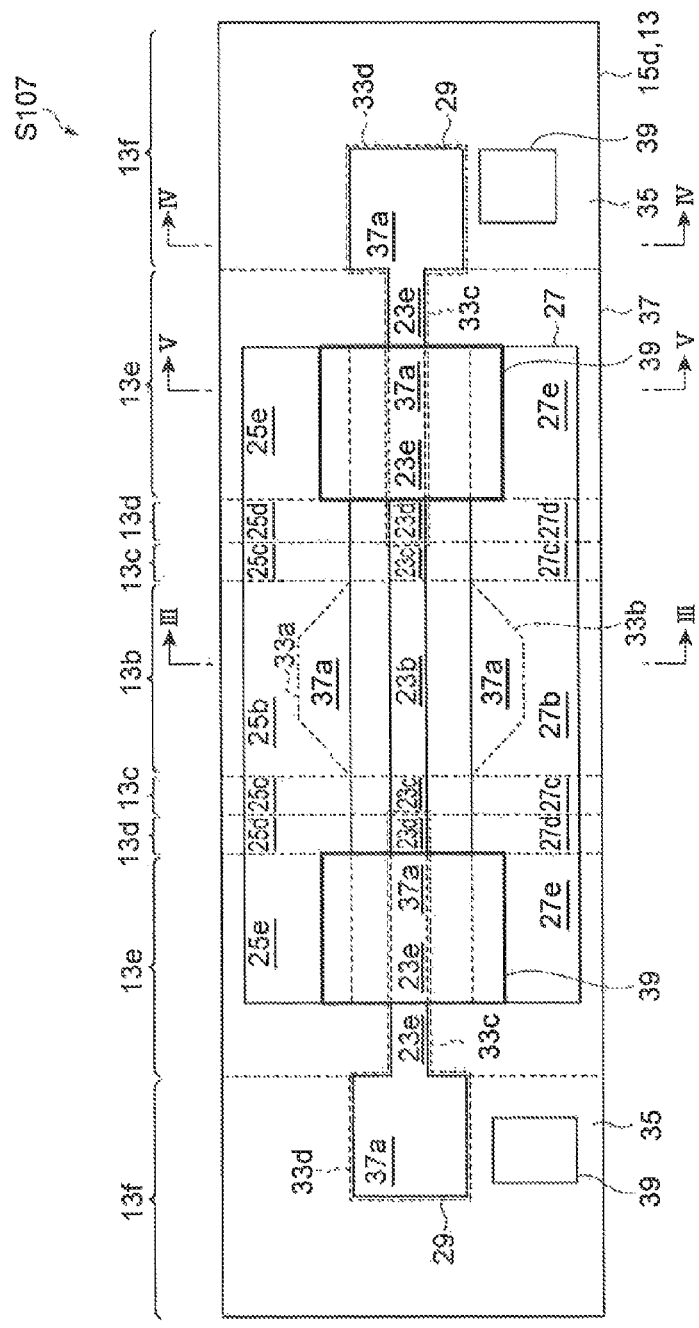
FIG. 8 is a schematic view illustrating a main step in the method for producing a spot size converter according to the embodiment.
Figure 9A:
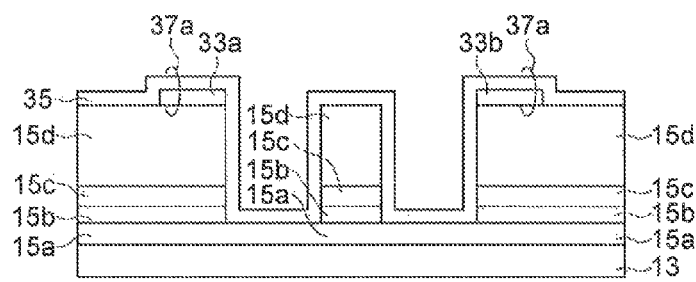
FIGS. 9A to 9C are schematic views illustrating a main step in the method for producing a spot size converter according to the embodiment.
Figure 9B:
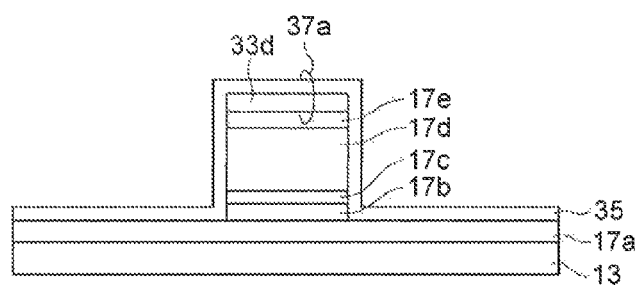
Figure 9C:
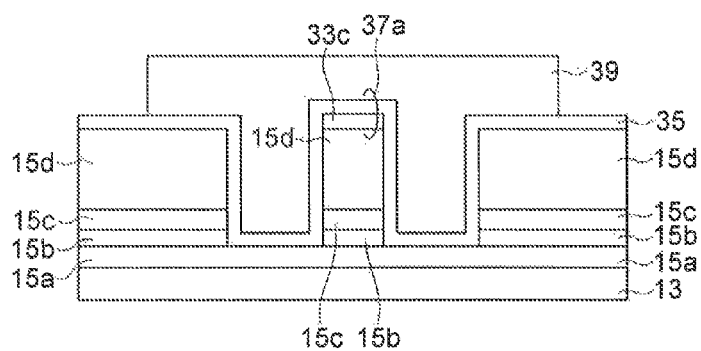

In step S107, as illustrated in FIG. 8, a second resist mask 39 is formed on the composite insulating layer 37. The second resist mask 39 has patterns each of which integrally covers the composite insulating layer 37 on a fourth terrace portion 25e, a fourth mesa portion 23e, and an eighth terrace portion 27e. FIGS. 9A to 9C each illustrate a cross section of a device after the second resist mask 39 is formed on the composite insulating layer 37. Specifically, FIG. 9A illustrates a cross section taken along line III-III in FIG. 8. FIG. 9B illustrates a cross section taken along line IV-IV in FIG. 8. FIG. 9C illustrates a cross section taken along line V-V in FIG. 8.

Figure 10:
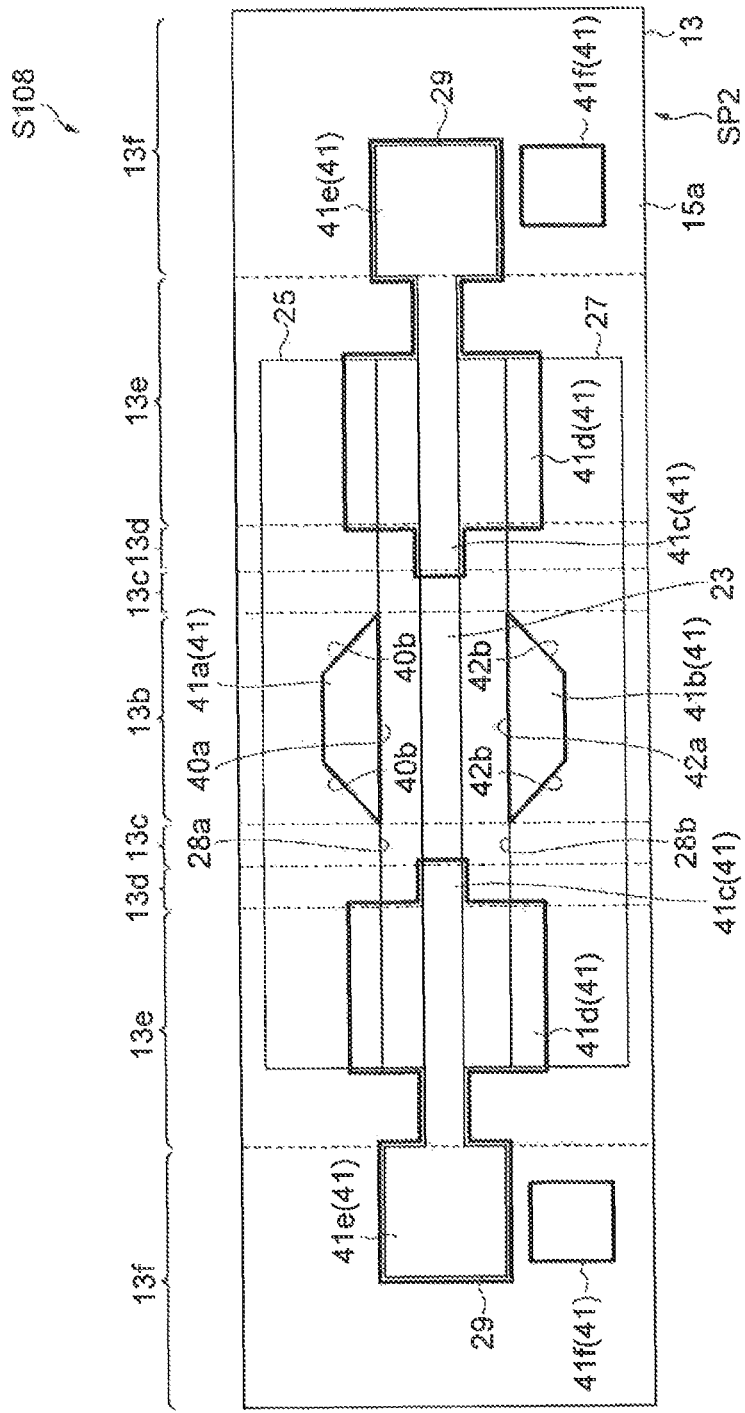
FIG. 10 is a schematic view illustrating a main step in the method for producing a spot size converter according to the embodiment.

In step S108, as illustrated in FIG. 10, the composite insulating layer 37 is etched by using the second resist mask 39 to form an insulator mask 41. In the embodiment, the insulator mask 41 is a second insulator mask. As a result of this etching, the composite insulating layer 37 that is covered with the second resist mask 39 and the thick-film portion 37a are left. In this etching, the thick-film portion 37a is left even when the surface of the thick-film portion 37a is not covered with the second resist mask 39. The thin-film portion 37b that is not covered with the second resist mask 39 is removed by this etching. Practically, this etching may be controlled by measuring the etching time. This etching is performed by, for example, wet etching. The insulator mask 41 includes a first pattern 41a, a second pattern 41b, third patterns 41c, fourth patterns 41d, and fifth patterns 41e. The first pattern 41a is located on the first terrace portion 25b. The second pattern 41b is located on the fifth terrace portion 27b. The third patterns 41c are located on the third mesa portions 23d and the fourth mesa portions 23e. The fourth patterns 41d each integrally cover a region extending from the fourth terrace portion 25e to the eighth terrace portion 27e through the fourth mesa portion 23e. The fifth patterns 41e each cover a top surface of the semiconductor device mesa 29. In addition, the insulator mask 41 may have sixth patterns 41f on the fifth areas 13f in order to provide electrode-forming regions for electrically connecting to the semiconductor device mesas 29. The pattern of the second resist mask 39 can be used in order to form the sixth patterns 41f.

In an embodiment in which a SiN mask is used as the insulator mask 21, a buffered hydrofluoric acid (BHF) may be used in wet etching. In the waveguide mesa 23, the first terrace 25, the second terrace 27, and the semiconductor device mesas 29, an insulating layer on side surfaces that are not covered with the second resist mask 39 is removed by this wet etching. After the etching, the second resist mask 39 is removed.

Figure 11:
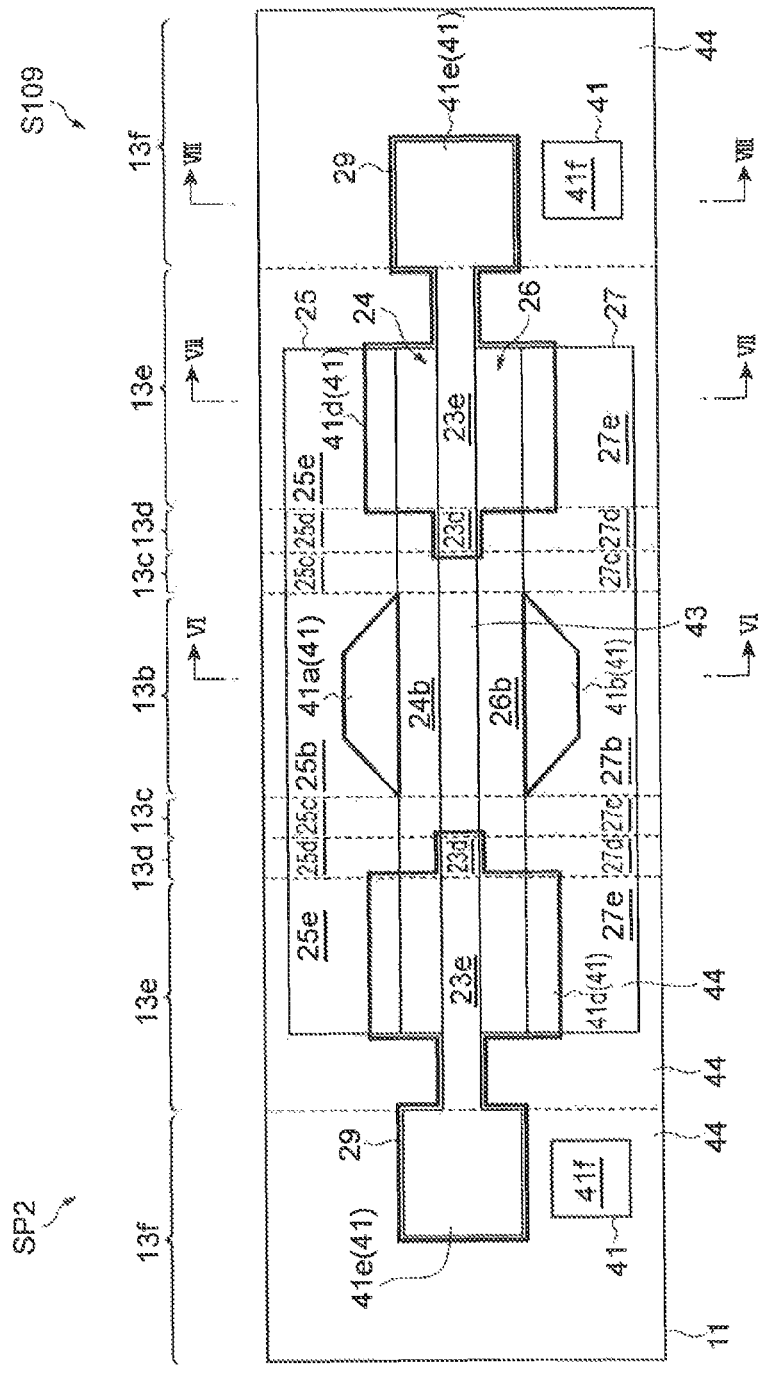
FIG. 11 is a schematic view illustrating a main step in the method for producing a spot size converter according to the embodiment.

Subsequently, a second substrate product SP2 including the insulator mask 41 is placed in a growth chamber of an epitaxial growth equipment (for example, MOVPE equipment). In step S109, as illustrated in FIG. 11, a raw material is supplied into the growth chamber, and, for example, an undoped semiconductor layer is selectively grown on the second substrate product SP2. For example, an MOVPE method is used in this crystal growth. Specifically, an undoped semiconductor layer is grown on the waveguide mesa 23, the first terrace 25, and the second terrace 27, all of which have been formed by etching the stacked semiconductor layer, thus forming an optical waveguide 43 in which the height of a mesa is changed in the direction of the waveguide axis Ax. In addition, the undoped semiconductor layer is grown on a side surface of the semiconductor device mesas 29 so as to bury the semiconductor device mesas 29. When the insulator mask 41 includes the sixth patterns 41f, crystal growth does not occur in areas that are covered with the sixth patterns 41f. An underlying conductive semiconductor is disposed under the sixth patterns 41f. Therefore, electrode-forming regions for electrically connecting to the semiconductor device mesas 29 may be formed by using the sixth patterns 41f.

According to the method for producing a spot size converter in the present embodiment, a waveguide mesa 23, a first terrace 25, a second terrace 27, and semiconductor device mesas 29 are formed from a stacked semiconductor layer 11 of an epitaxial substrate E by etching using an insulator mask 21. Subsequently, the insulator mask 21 is processed by using a first resist mask 31 including a first resist pattern 31a, a second resist pattern 31b, third resist patterns 31c, and fourth resist patterns 31d to form an insulator mask 33. The first resist pattern 31a of the first resist mask 31 is formed on the insulator mask 21 on a first terrace portion 25b, and corresponds to a first pattern 41a. The second resist pattern 31b is formed on the insulator mask 21 on a fifth terrace portion 27b, and corresponds to a second pattern 41b. The third resist patterns 31c are formed on the insulator mask 21 on third mesa portions 23d and fourth mesa portions 23e, and correspond to third patterns 41c. The fourth resist patterns 31d are formed on the insulator mask 21 on the semiconductor device mesas 29, and correspond to fifth patterns 41e. Subsequently, after removing the first resist mask 31, a new insulating layer 35 is formed to form a composite insulating layer 37. The composite insulating layer 37 is then etched by using a second resist mask 39 having patterns each of which integrally covers the composite insulating layer 37 on a fourth terrace portion 25e, a fourth mesa portion 23e, and an eighth terrace portion 27e. Thus, after removing the second resist mask 39, an insulator mask 41 is formed.

Accordingly, in the present embodiment, the insulator mask 41 includes the pattern of the insulator mask 33 having a pattern while partially maintaining the shape of the insulator mask 21. In addition, the insulator mask 41 includes the pattern of the composite insulating layer 37 including the new insulating layer 35, and further includes the pattern corresponding to the pattern of the second resist mask 39.

By using the insulator mask 41, a semiconductor layer is selectively grown on the waveguide mesa 23, the first terrace 25, and the second terrace 27, all of which have been formed by etching the stacked semiconductor layer. In addition, the semiconductor layer is selectively grown on a side surface of the semiconductor device mesas 29 so as to bury the semiconductor device mesas 29. Thus, an optical waveguide 43 in which the height of a mesa is changed in the direction of the waveguide axis Ax is formed.

Specifically, in the step of growing a semiconductor layer by using the insulator mask 41, the semiconductor layer is selectively grown on a first mesa portion 23b and second mesa portions 23c, which are not covered with the insulator mask 41. In this case, the first mesa portion 23b is located between the first pattern 41a of the insulator mask 41 and the second pattern 41b of the insulator mask 41. The first pattern 41a of the insulator mask 41 is located on the first terrace portion 25b. The second pattern 41b of the insulator mask 41 is located on the fifth terrace portion 27b. Therefore, a raw material that has not been consumed on the first pattern 41a and the second pattern 41b passes over trenches between the first terrace portion 25b and the first mesa portion 23b and between the fifth terrace portion 27b and the first mesa portion 23b. In addition, the raw material that has not been consumed on the first pattern 41a and the second pattern 41b is additionally supplied to the first mesa portion 23b in two directions from the first terrace portion 25b to the first mesa portion 23b and from the fifth terrace portion 27b to the first mesa portion 23b. As a result, the growth in the first mesa portion 23b increases, and the height of the mesa increases.

On the other hand, regarding each of the second mesa portions 23c, the second terrace portion 25c and the sixth terrace portion 27c are not covered with the insulator mask 41. The second mesa portion 23c is located between the second terrace portion 25c and the sixth terrace portion 27c. Therefore, a semiconductor layer is grown while a raw material is consumed on the second terrace portion 25c and the sixth terrace portion 27c and the raw material is consumed also on the second mesa portion 23c.

Furthermore, each of the third patterns 41c of the insulator mask 41 is located on the third mesa portion 23d and the fourth mesa portion 23e. In addition, each of the fourth patterns 41d of the insulator mask 41 integrally covers a region extending from the fourth terrace portion 25e to the eighth terrace portion 27e through the fourth mesa portion 23e. Accordingly, since a semiconductor layer is not grown on the third mesa portion 23d and the fourth mesa portion 23e, the height of the third mesa portion 23d and the height of the fourth mesa portion 23e do not change. However, a part of the raw material that has not been consumed on the third pattern 41c and the fourth pattern 41d is additionally supplied to the second mesa portion 23c, which is located adjacent to the third pattern 41c and the fourth pattern 41d and is not covered with the insulator mask 41. As a result, the mesa height of the second mesa portion 23c is also changed to be increased.

By using the insulator mask 41 having the shape described above, the optical waveguide 43 in which the height of a mesa is changed in the direction of the waveguide axis Ax is formed. This waveguide shape may be used for the conversion of a spot size.

Figure 12A:
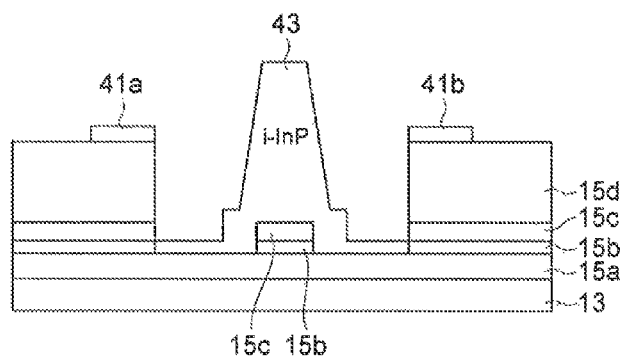
FIGS. 12A to 12C are schematic views illustrating a main step in the method for producing a spot size converter according to the embodiment.
Figure 12B:
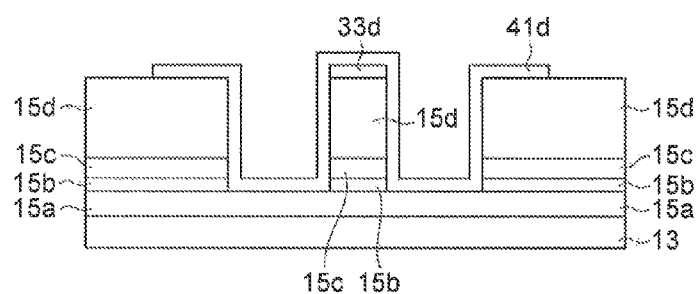
Figure 12C:
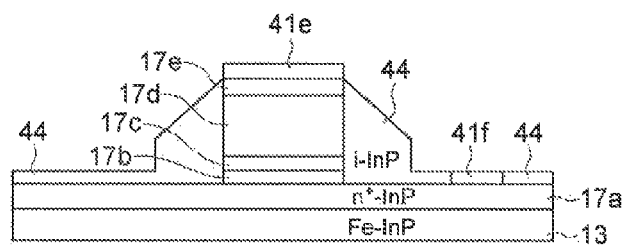

FIGS. 12A to 12C each illustrate a cross section of a device after a semiconductor layer is selectively grown by using the insulator mask 41. FIG. 12A is a cross-sectional view taken along line VI-VI in FIG. 11. FIG. 12B is a cross-sectional view taken along line VII-VII in FIG. 11. FIG. 12C is a cross-sectional view taken along line VIII-VIII in FIG. 11.

After the semiconductor layer is grown in step S109, the insulator mask 41 is removed. As a result of the growth of the semiconductor layer, an undoped semiconductor 44 is grown on a surface of the second substrate product SP2, the surface not being covered with the insulator mask 41. The undoped semiconductor 44 is composed of, for example, i-InP (non-doped InP). An undoped semiconductor (for example, i-InP) 15d is exposed on a surface of the second substrate product SP2, and surfaces of the waveguide mesa 23, the first terrace 25, and the second terrace 27, all of the surfaces having been covered with the insulator mask 41.

As described above, the main surface 13a of the substrate 13 includes a fifth area 13f for forming a semiconductor device that is connected to a spot size converter. A fourth area 13e is located between the fifth area 13f and a third area 13d. The stacked semiconductor layer 11 includes the laminated structure (semiconductor laminate) 17 for forming a photodiode provided on the fifth area 13f. A semiconductor device mesa 29 that constitutes the photodiode is formed by using the insulator mask 21 in the step of forming the waveguide mesa 23, the first terrace 25, and the second terrace 27. According to this method, the semiconductor device mesa 29 including the semiconductor laminate for forming a semiconductor device is connected to the waveguide mesa 23. Therefore, in addition to a waveguide for converting a spot size, a semiconductor device that is connected to the waveguide mesa 23 is also monolithically produced on a single substrate.

The insulator mask 41 may further include a pattern 41f defined by the pattern 33d. As described above, in the step of growing a semiconductor layer on the second substrate product SP2 by using the insulator mask 41, the semiconductor layer is also grown on the side surfaces of the semiconductor device mesa 29 (refer to FIG. 12C). According to this method, the semiconductor 44 grown on the side surfaces of the semiconductor device mesa 29 functions as a protective film of the semiconductor device.

Referring to FIG. 10, the first pattern 41a includes a first edge (first side) 40a and second edges (second sides) 40b. The first edge (first side) 40a extends along an edge 28a of an upper surface of the first terrace portion 25b. Each of the second edges (second sides) 40b extends from an end of the first edge 40a and gradually deviates from the edge 28a of the upper surface of the first terrace portion 25b in a direction from the second area 13c to the first area 13b. The second pattern 41b includes a first edge (first side) 42a and second edges (second sides) 42b. The first edge (first side) 42a extends along an edge 28b of an upper surface of the fifth terrace portion 27b. Each of the second edges (second sides) 42b extends from an end of the first edge 42a and gradually deviates from the edge 28b of the upper surface of the fifth terrace portion 27b in a direction from the second area 13c to the first area 13b. According to this method, the degree of consumption of a raw material on the first terrace 25 and the second terrace 27 may be adjusted by controlling the shapes of the first pattern 41a and the second pattern 41b of the insulator mask 41 in selectively growing the semiconductor layer using the insulator mask 41. For example, in order to adjust the consumption of a raw material on the first terrace 25 and the second terrace 27, it is possible to utilize the shape of the first pattern 41a (second pattern 41b) including the second edges 40b (second edges 42b) each of which extends from an end of the first edge 40a (first edge 42a) extending along the upper surface of the first terrace portion 25b (fifth terrace portion 27b) and that gradually deviates from the edge of the upper surface of the first terrace portion 25b (fifth terrace portion 27b) in a direction from a second area 13c to the first area 13b. Accordingly, in the growth of a semiconductor layer in step S109, the height of the mesa changes in the direction of the waveguide axis Ax depending on the shapes of the first pattern 41a and the second pattern 41b of the insulator mask 41. In the embodiment, the first edges 40a and 42a substantially coincide with the edges 28a and 28b of the upper surfaces of the first terrace portion 25b and the fifth terrace portion 27b, respectively. Therefore, the first edges (first sides) 40a and 42a each extend in the form of a straight line. On the other hand, the second edges (second sides) 40b and 42b may each extend so as to form a straight line, a circular arc, or a curved line.

As illustrated in FIG. 11, the first trench 24 that defines the first terrace 25 and the waveguide mesa 23 includes a first groove portion 24b disposed between the first terrace portion 25b and the first mesa portion 23b. The second trench 26 that defines the second terrace 27 and the waveguide mesa 23 includes a second groove portion 26b disposed between the fifth terrace portion 27b and the first mesa portion 23b. In the step of growing the semiconductor layer on the waveguide mesa portion, the first groove portion 24b and the second groove portion 26b are not covered with the insulator mask 41.

In the present embodiment, the first terrace 25, the second terrace 27, and the waveguide mesa 23 are prepared from the stacked semiconductor layer 11. Accordingly, the first terrace 25, the second terrace 27, and the waveguide mesa 23 have substantially the same height. The bottom surfaces and side surfaces of the first groove portion 24b and the second groove portion 26b are not covered with the insulator mask 41. In the selective growth of a semiconductor layer, a raw material that has not been consumed on the first terrace 25 and the second terrace 27 migrates along the surface of the insulator mask 41 on the first terrace 25 and the second terrace 27, and adheres to the surfaces of the first groove portion 24b and the second groove portion 26b, thus contributing to the growth of the semiconductor layer. However, a part of the raw material for growth may pass over the first groove portion 24b and the second groove portion 26b and arrive on the waveguide mesa 23 having a height substantially the same as that of the first terrace 25 and the second terrace 27.

The waveguide mesa 23 includes a first cladding layer, a core layer, and a second cladding layer that are sequentially provided on the main surface 13a of the substrate 13. The second cladding layer is preferably composed of InP. In the step of growing a semiconductor layer on the second substrate product SP2, a raw material that is used for growing an InP layer (for example, trimethylindium (TMIn) and phosphine ($PH_3$)) is supplied. According to this method, in the step of growing a semiconductor layer on the second substrate product SP2, a raw material for growing an InP layer migrates on a surface of the second substrate product SP2. An InP layer (for example, i-InP layer) is then grown on the second cladding layer of the waveguide mesa 23 exposed through the insulator mask 41.

Since the insulator mask 41 does not cover the side surfaces of the waveguide mesa 23, the migration of the raw material and the crystal growth may occur. On the other hand, the insulator mask 41 is located on the first terrace 25 and the second terrace 27. Therefore, a raw material that is not consumed is supplied along the surface of the insulator mask 41 on the first terrace 25 and the second terrace 27 in the step of selectively growing a semiconductor layer. In this embodiment, since the first groove portion 24b and the second groove portion 26b are provided, the raw material for crystal growth is also supplied to the side surfaces of the waveguide mesa 23.

Therefore, by selectively growing a semiconductor layer using the insulator mask 41, a spot size converter (SSC) portion 43 is formed from the waveguide mesa 23. The spot size converter (SSC) portion 43 has a height larger than that of the third mesa portion 23d, and includes a portion having a width (waveguide width) that tapers in a direction away from the main surface 13a of the substrate 13 (refer to FIG. 12A).

Figure 13:
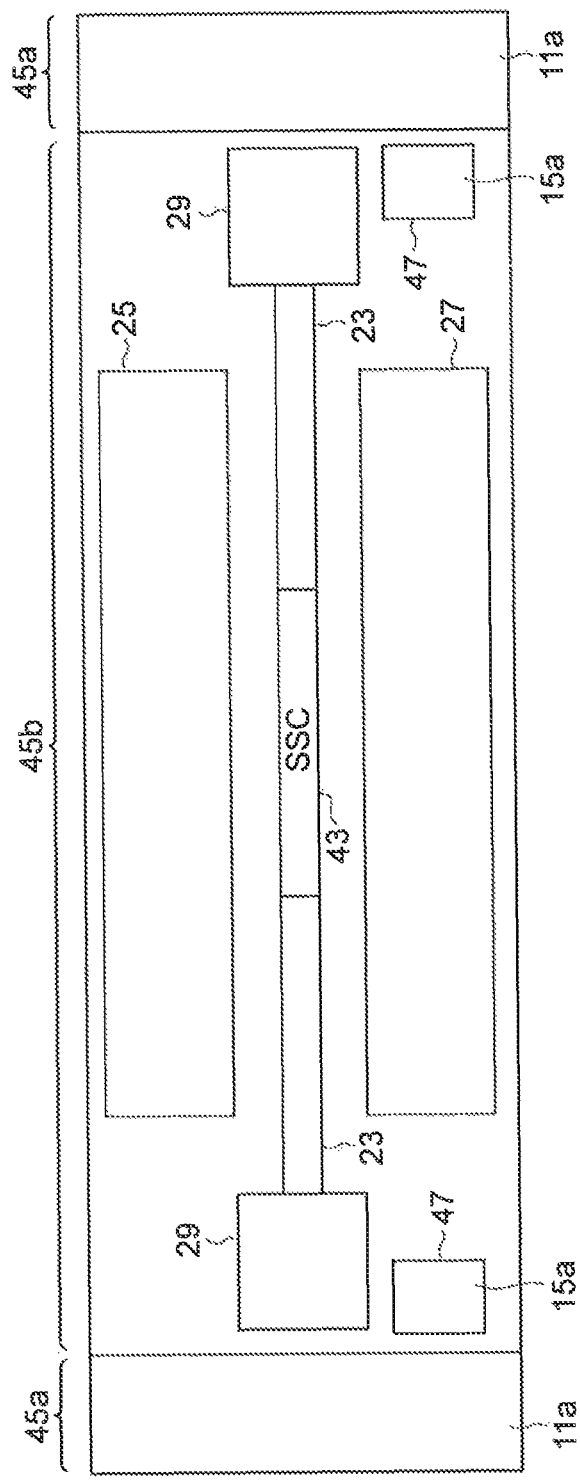
FIG. 13 is a schematic view illustrating a main step in the method for producing a spot size converter according to the embodiment.

As illustrated in FIG. 13, after the insulator mask 41 is removed, a device isolation mesa is formed. As a result of the formation of the device isolation mesa, in isolation areas 45a, an underlying conductive semiconductor layer (for example, semiconductor layer 15a) is removed and the substrate 13 is exposed. In a device area 45b, which is isolated by the isolation areas 45a, the underlying conductive semiconductor layer (for example, semiconductor layer 15a) appears in contact regions 47.

Figure 14:
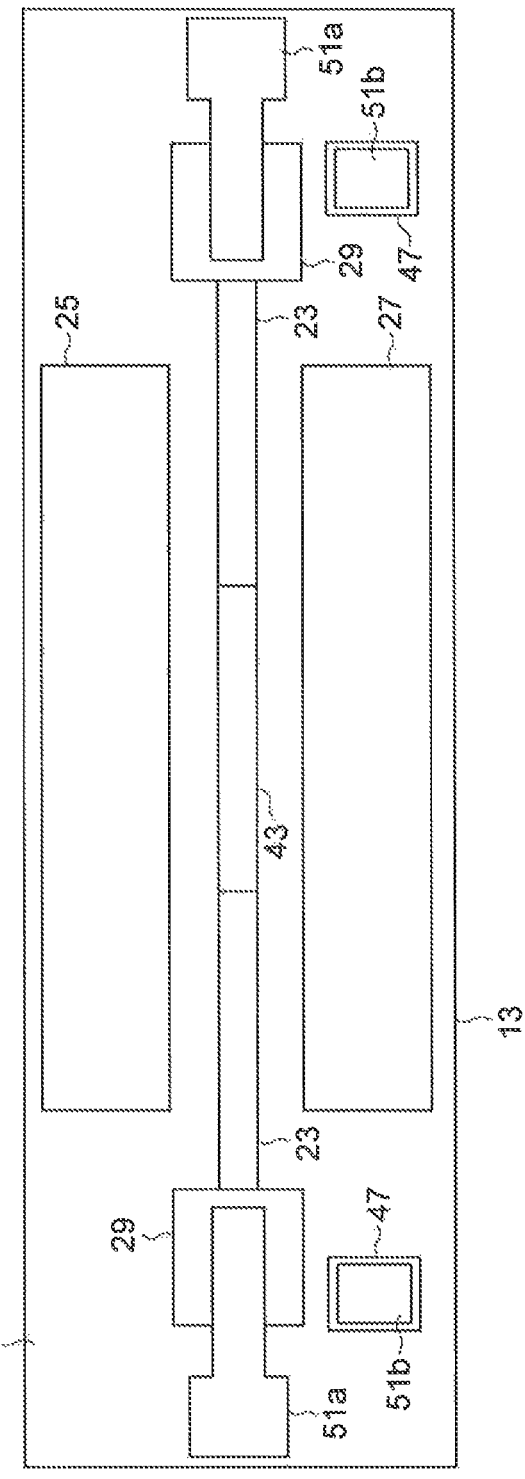
FIG. 14 is a schematic view illustrating a main step in the method for producing a spot size converter according to the embodiment.

As illustrated in FIG. 14, after the device isolation mesa is formed, a protective film 49 is formed over the entire surface. The protective film 49 is constituted by, for example, a SiN film. Next, openings are formed in the protective film 49, and electrodes 51a and 51b for supplying a voltage to semiconductor devices are formed in the openings.

EXAMPLE

First Epitaxial Growth by Metal-Organic Vapor Phase Epitaxy (MOVPE) Method

First, an n-InP contact layer, an n-InP buffer layer, an i-GaInAs absorption layer (having a thickness of 400 nm), a p-InP cladding layer, and a $p^+$-GaInAs contact layer are grown on a semi-insulating InP (InP doped with Fe) substrate by an MOVPE method.
Formation of Butt-Joint Pattern
A SiN film having a thickness of 200 nm is deposited by a chemical vapor deposition (CVD) method. Subsequently, a SiN mask having a butt-joint pattern is formed by photolithography and etching with buffered hydrofluoric acid (BHF).
Formation of Butt-Joint
First, a butt-joint mesa is formed by wet etching using an HCl-based or HBr-based etchant using the SiN mask. When the i-GaInAs absorption layer is etched, the n-InP buffer layer functions as an etch stop layer.
Regrowth of Butt-Joint
Subsequently, a lower i-InP cladding layer, an i-GaInAsP core layer (band gap wavelength: 1,300 nm), and an upper i-InP cladding layer are regrown by using the SiN mask, which is used in the butt-joint mesa formation, as a mask for selective growth. In this step, thicknesses of the respective layers are adjusted so that the i-GaInAsP core layer and the i-GaInAs absorption layer of a semiconductor device are optically coupled to each other.
Formation of Waveguide Mesa Pattern
A SiN film having a thickness of 300 nm is formed, and a resist pattern of a waveguide mesa is then formed by photolithography. Subsequently, this resist pattern is transferred to the SiN film by reactive ion etching (RIE) using $CF_4$ gas.
Formation of Waveguide Mesa
Mesas are formed at one time in a high-mesa waveguide region and a waveguide region including a photodiode (PD) portion by dry etching using a $Cl_2$-based gas.
Removal of Insulating Layer on Terraces
A resist mask having a pattern for leaving a SiN mask on a device mesa including the PD portion, a waveguide mesa, and terraces near a light input portion (chip end) functioning as a spot size converter (SSC) is formed by photolithography. The SiN film is removed by wet etching with BHF using this resist mask. In this step, the SiN mask is removed in a waveguide mesa region functioning as an SSC portion so that a semiconductor layer is grown on the upper i-InP cladding layer in a subsequent step. Subsequently, the resist mask is removed by using an organic solvent and oxygen plasma ashing.
Formation of Mask for Selective Growth
A SiN film having a thickness of 100 nm is deposited over the entire surface of the substrate. A resist mask is then formed by photolithography, and the SiN film is etched with BHF using the resist mask. Thus, a mask for selective growth is formed. Subsequently, the resist mask is removed by using an organic solvent and oxygen plasma ashing.

Selective Growth

A damaged layer on a surface of the semiconductor, the damaged layer being formed by the dry etching, is removed by wet etching using an HCl-based etchant. An InP layer is then grown by an MOVPE method using the mask for selective growth. After the InP layer is grown, the mask for selective growth is removed by wet etching using BHF.

Formation of Device Isolation Mesa

A SiN film having a thickness of 500 nm is formed. A resist mask having a pattern for forming a device isolation mesa is then formed by photolithography. The resist pattern is transferred to the SiN film using the resist mask by an RIE method with $CF_4$ gas. A device isolation mesa is formed by dry etching with a $Cl_2$-based gas using the patterned SiN film as an etching mask.

Formation of Protective Film and Formation of Ohmic Electrode

A SiN film having a thickness of 300 nm is formed as a protective film. Openings for forming electrodes are then formed in the protective film by photolithography and an RIE method using $CF_4$ gas. Subsequently, an ohmic electrode on the p side and an ohmic electrode on the n side are formed in the openings.

Figure 15:
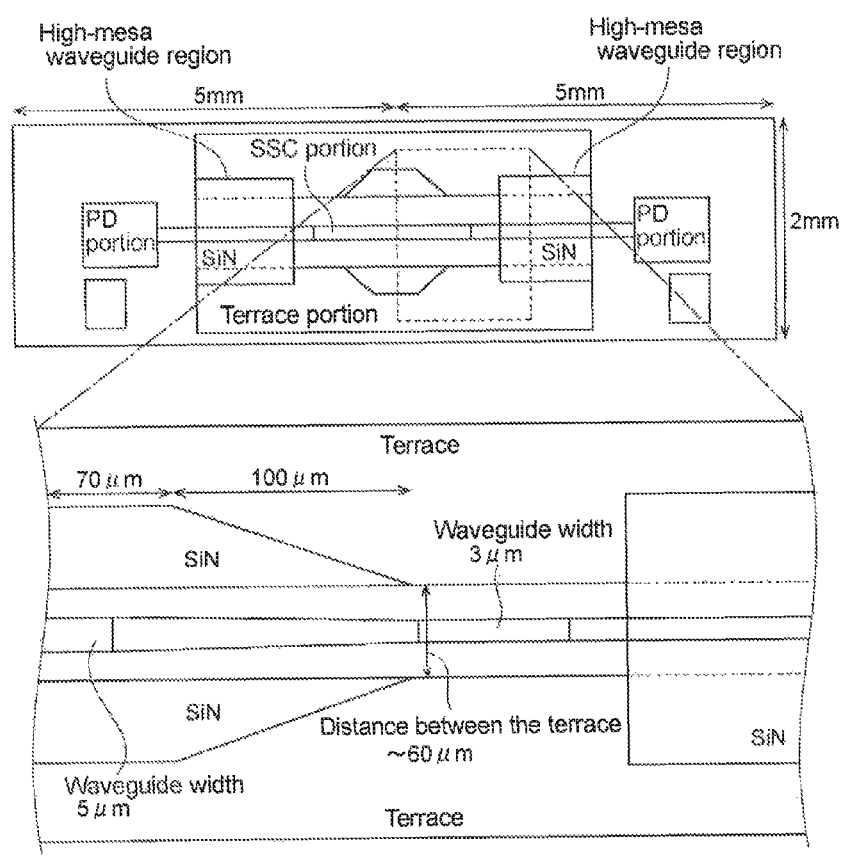
FIG. 15 includes views illustrating a semiconductor optical device including an SSC portion and formed in Example.

Through the above steps, a semiconductor device including an SSC portion and illustrated in FIG. 15 is formed. Finally, the substrate is divided into two portions (two semiconductor devices) by cleaving the substrate in a direction intersecting the waveguide direction at substantially the center part of the SSC portion. Thus, a semiconductor device including the SSC portion is completed.

In this Example, a stacked semiconductor layer including a butt joint is formed by using an epitaxial growth method. This stacked semiconductor layer is etched to form a waveguide mesa, a pair of semiconductor terraces disposed on both sides of the waveguide mesa, and a semiconductor device mesa for forming a semiconductor device PD (light-receiving device). Furthermore, regrowth is performed on a part of the waveguide mesa. Thus, an increase in the thickness of the upper InP cladding layer and a modification of a mesa cross section are performed in an optical coupling portion (waveguide end) for an SSC. In order to promote the migration of the raw material for growth and the growth of InP, a SiN mask (mask pattern on semiconductor terraces) is arranged on semiconductor terraces disposed on both sides of a semiconductor mesa for an SSC. In order to grow an InP layer also on side surfaces of the semiconductor device mesa, a SiN mask (mask pattern on device mesa) is also arranged on the semiconductor device mesa. In order to suppress abnormal growth at an interface between a region of an SSC of a waveguide end and a region having a SiN mask, a SiN mask pattern is not provided on the semiconductor terraces near the interface. In addition, in order to suppress abnormal growth on the SiN mask, a tapered pattern is used as a mask pattern on each of the semiconductor terraces. An InP layer is re-grown on not only the waveguide mesa but also the side surfaces of the semiconductor device mesa that are not covered with the SiN mask for the selective growth. Accordingly, a waveguide-type photodiode which has a high efficiency and a low dark-current is provided.

Figure 16A:
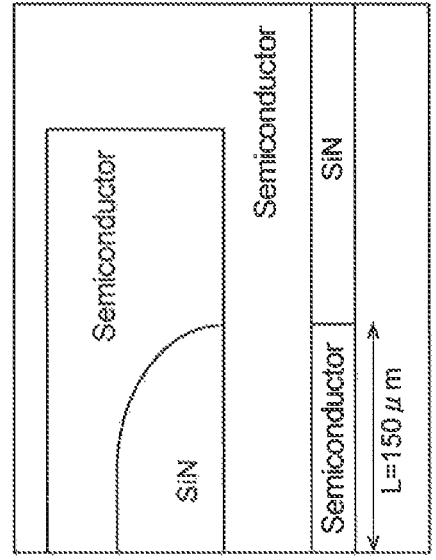
FIG. 16A is a plan view illustrating a shape of a SiN mask pattern on a semiconductor terrace.
Figure 16B:
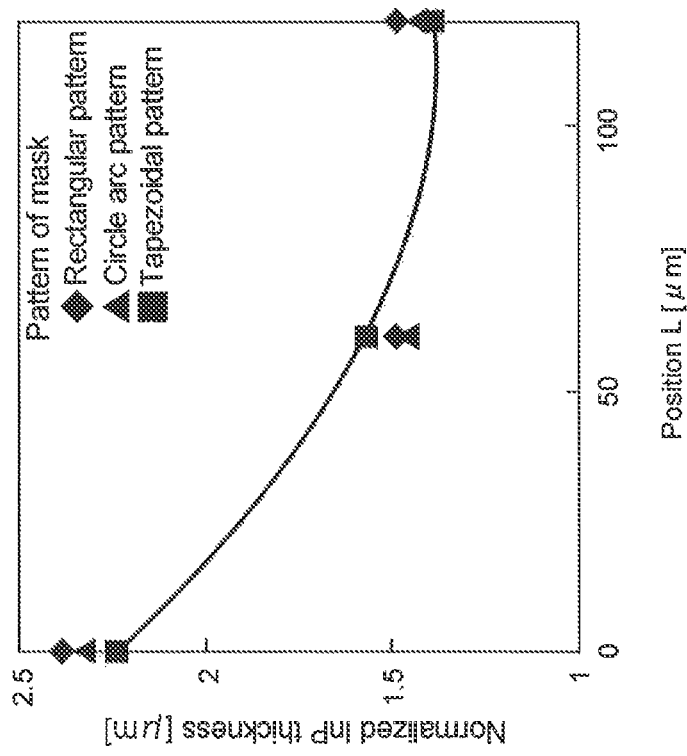
FIG. 16B is a graph showing a change in the thickness of an InP layer grown on an SSC portion in the case where the shape of the SiN mask pattern was changed.

FIGS. 16A and 16B show the relationship between the shape of a SiN mask pattern on a semiconductor terrace and a thickness of an InP layer grown on an SSC portion in the selective growth. FIG. 16A illustrates a pattern used in the experiment. FIG. 16B shows a distance dependence of a thickness of an InP layer when the InP layer is selectively grown by using, as a selective growth mask, a SiN mask having the pattern illustrated in FIG. 16A. The rhombic symbols show a change in the thickness of an InP layer when a SiN mask having a rectangular pattern is used. The triangular symbols show a change in the thickness of an InP layer when a SiN mask having a circular arc pattern is used. The square symbols show a change in the thickness of an InP layer when a SiN mask having a trapezoidal pattern is used. The SiN masks having these patterns are useful for adjusting a region of an SSC in a waveguide.

Regarding a portion of the waveguide mesa except for the SSC portion (for example, the third portion of the waveguide mesa), the upper surface of the portion is covered with a SiN mask. However, side surfaces of the portion are not covered with a SiN mask. Therefore, in the step of the selective growth, an InP layer is selectively grown on the side surfaces of the portion of the waveguide mesa, the portion not being covered with the SiN mask. The InP layer grown on the side surfaces functions as a protective film. A portion of side surfaces of the waveguide mesa connected to a waveguide-type photodiode (for example, the fourth portion of the waveguide mesa) is covered with a SiN mask. Therefore, in the step of the selective growth of the InP layer, an InP layer is not grown on the side surfaces that are covered with the SiN mask.

The present invention is not limited to specific structures disclosed in the above embodiments.

What is claimed is:

1. A method for producing a spot size converter comprising the steps of:

preparing a substrate including a main surface having a first area, a second area, a third area, and a fourth area that are arranged in a direction of a waveguide axis;

forming a stacked semiconductor layer disposed on the main surface of the substrate;

forming a first insulator mask on the stacked semiconductor layer;

forming a substrate product including a first terrace, a second terrace, and a waveguide mesa disposed between the first terrace and the second terrace by etching the stacked semiconductor layer using the first insulator mask, the first terrace having a first terrace portion, a second terrace portion, a third terrace portion, and a fourth terrace portion that are respectively disposed on the first area, the second area, the third area, and the fourth area, the second terrace having a fifth terrace portion, a sixth terrace portion, a seventh terrace portion, and an eighth terrace portion that are respectively disposed on the first area, the second area, the third area, and the fourth area, the waveguide mesa having a first mesa portion, a second mesa portion, a third mesa portion, and a fourth mesa portion that are respectively disposed on the first area, the second area, the third area, and the fourth area;

forming a second insulator mask on the substrate product, the second insulator mask including a first pattern disposed on the first terrace portion, a second pattern disposed on the fifth terrace portion, a third pattern disposed on the third mesa portion and the fourth mesa portion, and a fourth pattern that integrally covers a region extending from the fourth terrace portion to the eighth terrace portion through the fourth mesa portion; and selectively growing a semiconductor layer on the substrate product by using the second insulator mask.

2. The method for producing a spot size converter according to claim 1, further comprising a step of, after forming the substrate product including the first terrace, the second terrace, and the waveguide mesa, forming a first resist mask on the first insulator mask, the first resist mask having a first resist pattern disposed on the first terrace portion, a second resist pattern disposed on the fifth terrace portion, and a third resist pattern disposed on the third mesa portion and the fourth mesa portion, wherein the step of forming the second insulator mask includes the steps of:

etching the first insulator mask using the first resist mask to form a third insulator mask;

after removing the first resist mask, forming an insulating layer on the substrate product to form a composite insulating layer;

forming a second resist mask having a pattern that integrally covers the composite insulating layer on the fourth terrace portion, the fourth mesa portion, and the eighth terrace portion; and etching the composite insulating layer using the second resist mask.

3. The method for producing a spot size converter according to claim 2, wherein the composite insulating layer includes a thick-film portion including the insulating layer and the third insulator mask, and a thin-film portion including the insulating layer, and the thick-film portion has a thickness larger than that of the thin-film portion.

4. The method for producing a spot size converter according to claim 1, wherein the main surface of the substrate has a fifth area, the fourth area is disposed between the third area and the fifth area, the stacked semiconductor layer includes a laminated structure disposed on the fifth area, the laminated structure including an absorption layer of a semiconductor device, the second insulator mask includes a fifth pattern covering a top surface of the laminated structure on the fifth area, and the step of forming the substrate product including the first terrace, the second terrace, and the waveguide mesa includes forming a device mesa by etching the stacked semiconductor layer using the first insulator mask.

5. The method for producing a spot size converter according to claim 4, wherein, in the step of selectively growing the semiconductor layer, the semiconductor layer is grown on a side surface of the device mesa.

6. The method for producing a spot size converter according to claim 1, wherein the first pattern of the second insulator mask includes a first edge that extends along an edge of an upper surface of the first terrace portion and a second edge that extends from an end of the first edge of the first pattern and gradually deviates from the edge of the upper surface of the first terrace portion in a direction from the second area to the first area, and the second pattern of the second insulator mask includes a first edge that extends along an edge of an upper surface of the fifth terrace portion and a second edge that extends from an end of the first edge of the second pattern and gradually deviates from the edge of the upper surface of the fifth terrace portion in a direction from the second area to the first area.

7. The method for producing a spot size converter according to claim 1, wherein the first terrace and the waveguide mesa are defined by a first trench that is located between the first terrace and the waveguide mesa, the first trench including a first groove portion located between the first terrace portion and the first mesa portion, the second terrace and the waveguide mesa are defined by a second trench that is located between the second terrace and the waveguide mesa, the second trench including a second groove portion located between the fifth terrace portion and the first mesa portion, each of the first and second groove portions has a bottom surface and a side surface, and in the step of selectively growing the semiconductor layer, the bottom surfaces and the side surfaces of the first and second groove portions are not covered with the second insulator mask.

8. The method for producing a spot size converter according to claim 1, wherein the waveguide mesa includes a first cladding layer, a core layer, and a second cladding layer that are sequentially disposed on the main surface of the substrate, the second cladding layer is composed of InP, and the semiconductor layer that is selectively grown on the substrate product is composed of InP.

9. The method for producing a spot size converter according to claim 1, wherein, in the step of selectively growing the semiconductor layer, the waveguide mesa includes a spot size converter portion in the first mesa portion, the spot size converter portion has a height larger than that of the third mesa portion, and the spot size converter portion includes a portion having a width that tapers in a direction away from the main surface of the substrate.

* * * * *